(12) United States Patent
Lin et al.

(10) Patent No.: US 7,821,082 B1
(45) Date of Patent: Oct. 26, 2010

(54) METHOD FOR INCREASING BREAKING DOWN VOLTAGE OF LATERAL DIFFUSED METAL OXIDE SEMICONDUCTOR TRANSISTOR

(75) Inventors: Kwang-Ming Lin, Hsinchu (TW); Shih-Chieh Pu, Taipei County (TW); Shih-Chan Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 12/431,571

(22) Filed: Apr. 28, 2009

(51) Int. Cl.
*H01L 29/66* (2006.01)

(52) U.S. Cl. .................................. 257/409; 257/492

(58) Field of Classification Search ............... 257/409, 257/492
See application file for complete search history.

(56) References Cited

U.S. PATENT DOCUMENTS

| 6,855,581 | B2 * | 2/2005 | Roh et al. ............... 438/156 |
| 7,122,876 | B2 * | 10/2006 | Wu et al. ............... 257/510 |

* cited by examiner

*Primary Examiner*—Trung Dang

(57) ABSTRACT

A lateral diffused metal oxide semiconductor transistor is disclosed. A p-type bulk is disposed on a substrate. An n-type well region is disposed in the p-type bulk. A plurality of field oxide layers are disposed on the p-type bulk and the n-type well region. A gate structure is disposed on a portion of the p-type bulk and one of the plurality of field oxide layers. At least one deep trench isolation structure is disposed in the p-type bulk and adjacent to the n-type well region.

16 Claims, 10 Drawing Sheets

METHOD FOR INCREASING BREAKING DOWN VOLTAGE OF LATERAL DIFFUSED METAL OXIDE SEMICONDUCTOR TRANSISTOR

BACKGROUND OF THE INVENTION

1. Field of the Invention

The invention relates to a semiconductor process, and more particularly related to a lateral diffused metal oxide semiconductor transistor (LDMOS).

2. Description of the Related Art

Power semiconductor devices are currently in wide use in many electronic products and the most common devices for high voltage integrated circuits are lateral diffused metal oxide semiconductor transistors (LDMOS). The LDMOS has advantages of specific on resistance and breakdown voltage and is capable of being integrated by a VLSI process.

Referring to FIG. 1, which shows a cross section of a conventional lateral diffused MOS transistor, a p-typed epitaxy layer 104 (also referred to as a p well) is disposed on a p-type silicon substrate 102, and an n well 106 is disposed in the p-type epitaxy layer 104. A plurality of field oxide layers (FOX) 108 are partially disposed on the p-typed epitaxy layer 104 and the n well 106. A gate structure 114 including a gate electrode 110 and a gate dielectric layer 112 is disposed on a portion of the p-type epitaxy 104, the n well 106 and the field oxide layer 108. An N+ source 116 formed by ion implantation is disposed on a side of the gate structure 114 and a N+ drain 118 is adjacent to the field oxide layer 108 neighboring the gate structure 114. Isolation between devices of the LDMOS can be increased by forming the field oxide 108 or extending well regions. The two methods, however, increase device size, which is contrary to miniaturization trends.

BRIEF SUMMARY OF INVENTION

According to the issues described, the invention provides a lateral diffused metal oxide semiconductor transistor. A p-type bulk is disposed on a substrate. An n-type well region is disposed in the p-type bulk. A plurality of field oxide layers are disposed on the p-type bulk and the n-type well region. A gate structure is disposed on a portion of the p-type bulk and one of the plurality of field oxide layers. At least one deep trench isolation structure is disposed in the p-type bulk and adjacent to the n-type well region.

The invention provides another lateral diffused metal oxide semiconductor transistor. A p-type bulk is disposed on a substrate. An n-type well region is disposed in the p-type bulk. A plurality of field oxide layers is disposed on the p-type bulk and the n-type well region. A gate structure is disposed on a portion of the p-type bulk and one of the plurality of a field oxide layer of the field oxide layers. A deep trench isolation structure for providing isolation between devices further insulates a breakdown path between the n-type well region and the p-type bulk.

The invention provides a method for increasing breaking down voltage of a lateral diffused metal oxide semiconductor transistor. A lateral diffused metal oxide semiconductor transistor is provided, comprising a p-type bulk disposed on the substrate, an n-type well region disposed in the p-type bulk, a plurality of field oxide layers disposed on the p-type bulk and the n-type well region, and a gate structure disposed on a portion of the p-type bulk and one of the plurality of field oxide layers. A deep trench isolation structure is formed at an interface between the n-type well region and the p-type bulk for insulating a junction breakdown path between the n-type well region and the p-type bulk and thus increase breaking down voltage of the lateral diffused metal oxide semiconductor transistor.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following descriptions are of the contemplated mode of carrying out the invention. The descriptions are made for the purpose of illustrating the general principles of the invention and should not be taken in a limiting sense.

Figure 1:
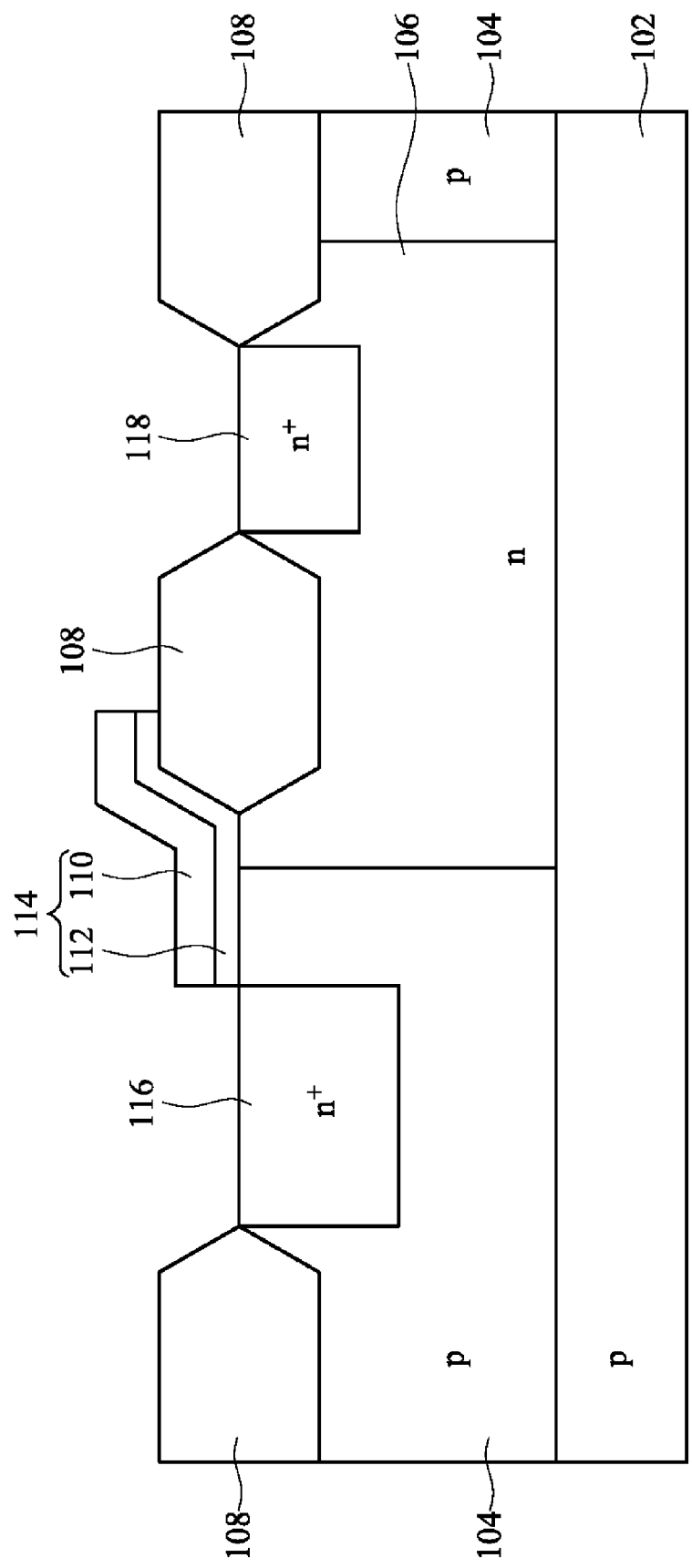
FIG. 1 shows a cross section of a conventional lateral diffused MOS transistor.
Figure 2A:
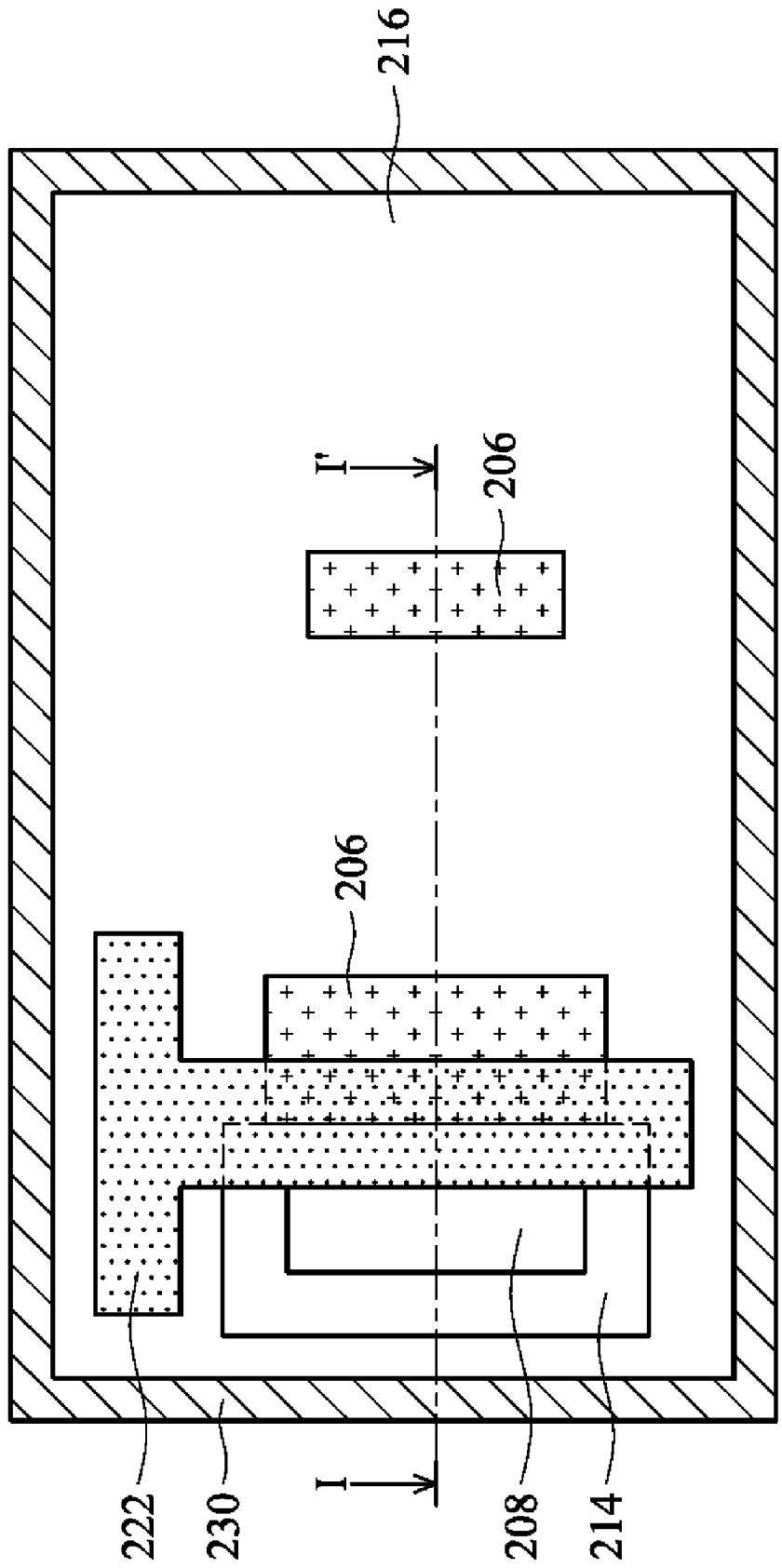
FIG. 2A shows a plane view of a lateral diffused metal oxide semiconductor transistor.
Figure 2B:
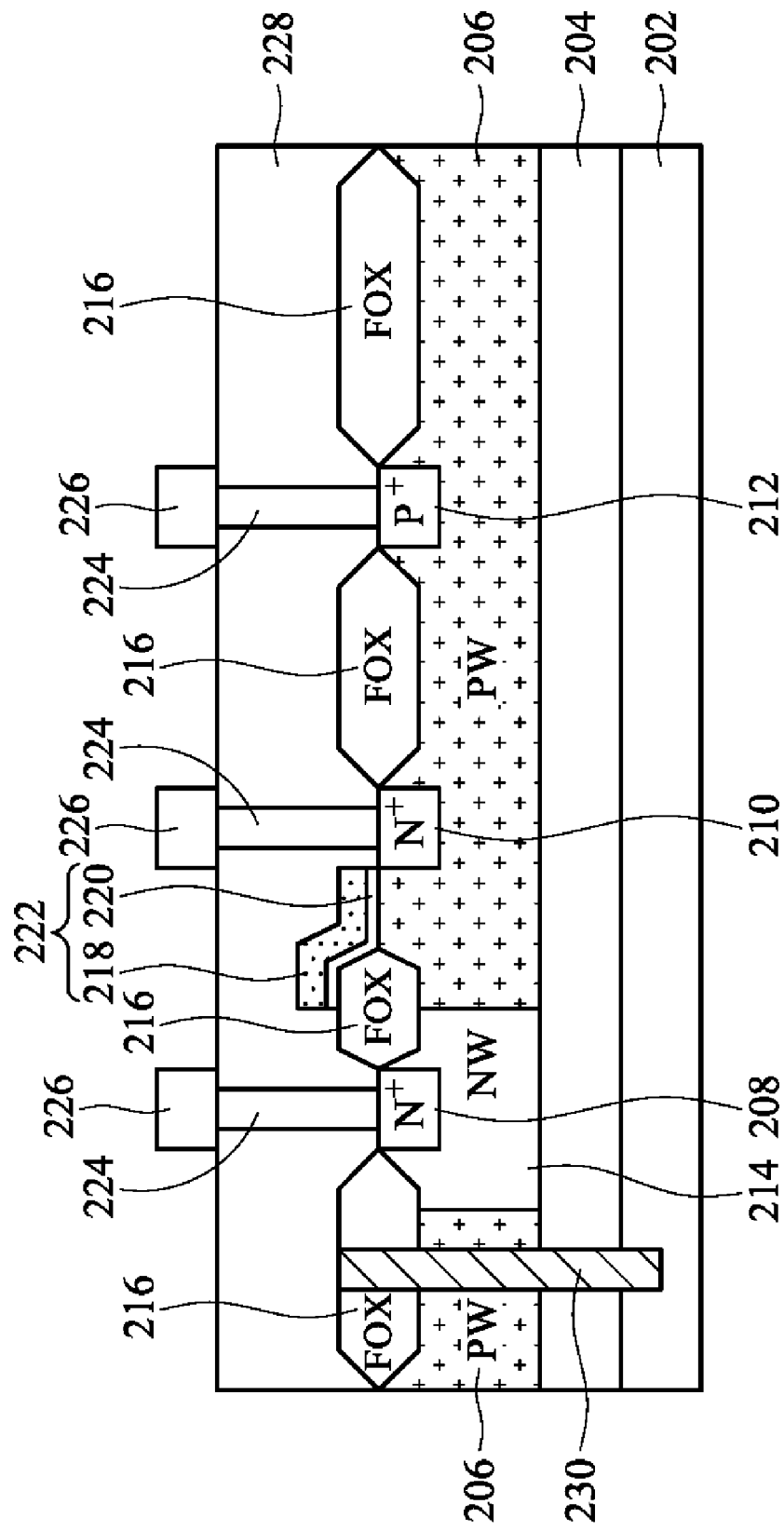
FIG. 2B shows a cross section along lines I-I' of FIG. 2A.

An asymmetric lateral diffused metal oxide semiconductor transistor (LDMOS) is illustrated in accordance with FIGS. 2A and 2B, in which a deep trench isolation (DTI) structure is used to isolate elements in a device. FIG. 2A shows a plane view of a lateral diffused metal oxide semiconductor transistor. FIG. 2B shows a cross section along lines I-I' of FIG. 2A. As shown in FIGS. 2A and 2B, a p-type epitaxy layer 204 is disposed on a p-type substrate 202. The p-type substrate 202 includes a p-type bulk 206 thereon and an n-type well 214 is formed in the p-well bulk 206. A plurality of field oxide layers (FOX) 216 are formed on the p-type bulk 206 and the n-type well region 214. A gate structure 222 including a gate electrode 218 and a gate dielectric layer 220 is disposed on a portion of the p-type bulk 206 and the field oxide layer 216. An N+ drain 208 is disposed n the n-type well region 214 and close to a side of a field oxide layer 216 neighboring the gate structure 222. An N+ source 210 neighbors the gate structure 222 on a side of the field oxide layer 216. A p+ base 212 is disposed on the p-type bulk 206 and between two field oxide layers 216. A dielectric layer 228 covers the field oxide layer 216, the gate structure 222 and the p-type bulk 206. A plurality of plugs 224 are formed in the dielectric layer 228 and a plurality of conductive lines 226 are formed on the corresponding plugs 224 to provide external electrical contact to the drain 208, the source 210 and the base 212. A deep trench isolation structure 230 which is filled with dielectric material, such as oxide, penetrates the field oxide layer 216, the p-type bulk 206, the p-type epitaxy layer 204 and extends into a portion of the substrate 202 to provide isolation between devices, wherein the deep trench isolation structure 230 can replace well isolation of conventional LDMOS to allow further device size shrinkage.

It is noted that the deep trench isolation structure 230 of the asymmetric LDMOS is separated from an n-type well region 214 in the p-type bulk 206 by a distance of 1~3 μm. However, point discharge easily occurs at the edge and corner of the n-type well region 214 and breakdown is easily generated thereat. Hence, breakdown voltage of the device can not be further enhanced.

Figure 3A:
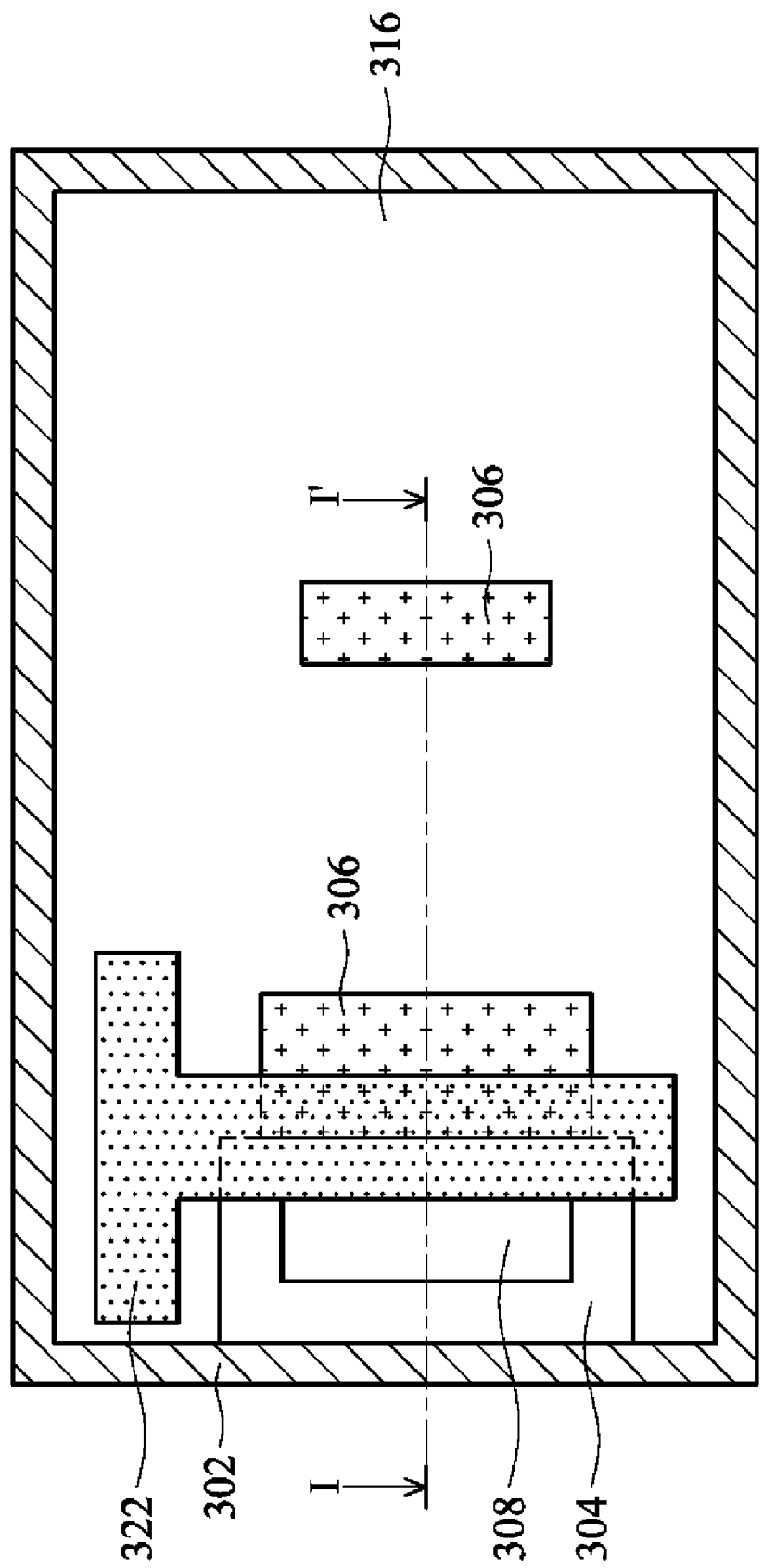
FIG. 3A shows a plane view of a lateral diffused metal oxide semiconductor transistor of an embodiment of the invention.
Figure 3B:
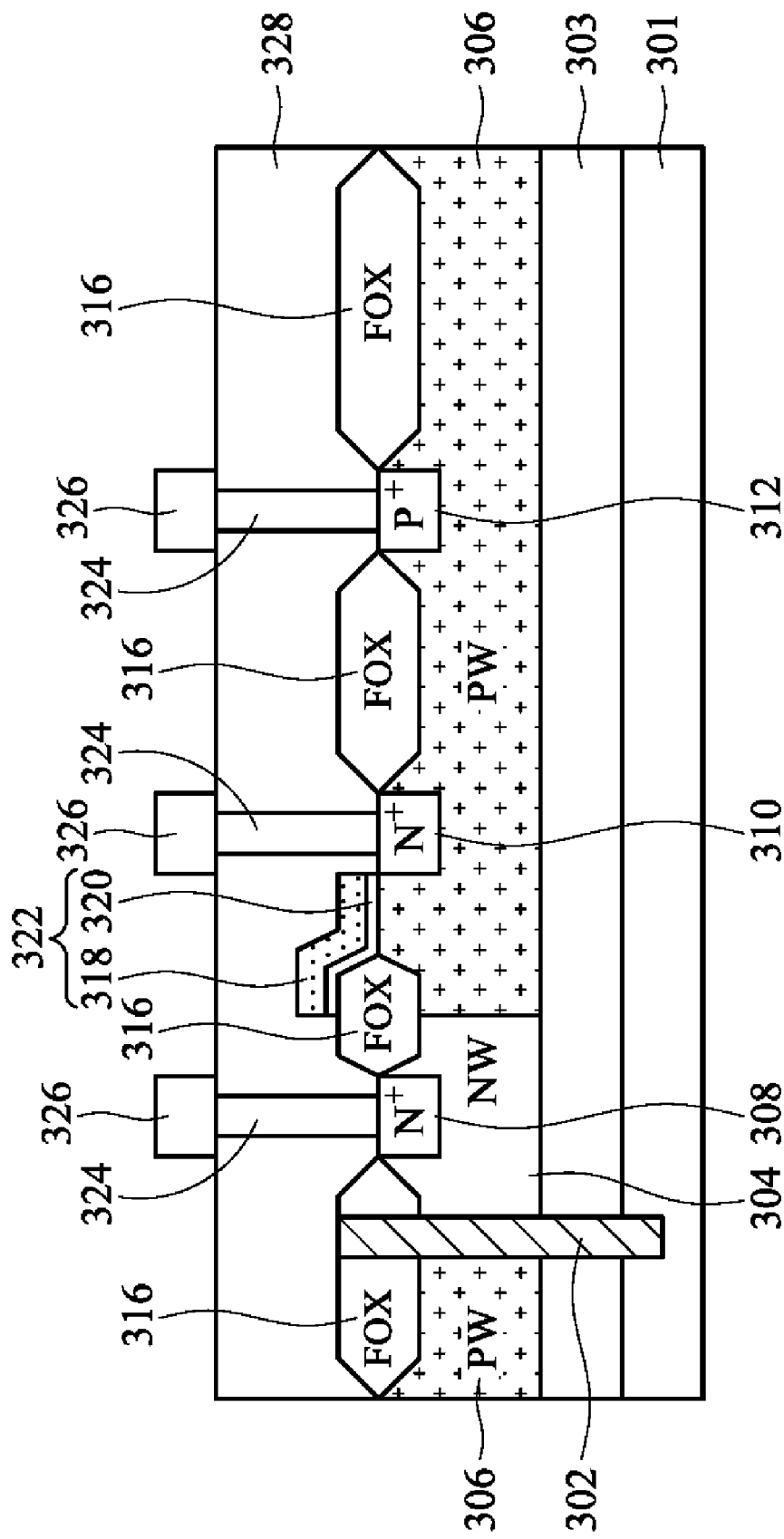
FIG. 3B shows a cross section along lines I-I' of FIG. 3A.

Accordingly, the invention provides an asymmetric LDMOS to address the aforementioned issue. An asymmetric lateral diffused metal oxide semiconductor transistor (LDMOS) of an embodiment of the invention is illustrated in accordance with FIGS. 3A and 3B, in which FIG. 3A shows a plane view of a lateral diffused metal oxide semiconductor transistor of the embodiment, and FIG. 3B shows a cross section along lines I-I' of FIG. 3A. Referring to FIGS. 3A and 3B, a p-type epitaxy layer 303 is disposed on a p-type substrate 301. The p-type substrate 301 includes a p-type bulk 306 thereon and an n-type well 304 is formed in the p-type bulk 306. A plurality of field oxide layers (FOX) 316 are formed on the p-type bulk 306 and the n-type well region 304. A gate structure 322 including a gate electrode 318 and a gate dielectric layer 320 is disposed on a portion of the p-type bulk 306 and the field oxide layer 316. An N+ drain 308 is disposed in the n-type well region 304 and close to a side of a field oxide layer 316 neighboring the gate structure 322. An N+ source 310 neighbors the gate structure 322 at a side of the field oxide layer 316. A p+ base 312 is disposed on the p-type bulk 306 and between two field oxide layers 316. A dielectric layer 328 covers the field oxide layer 316, the gate structure 322 and the p-type bulk 306. A plurality of plugs 324 are formed in the dielectric layer 328 and a plurality of conductive lines 326 are formed on the corresponding plugs 324 to provide external electrical contact to the drain 308, the source 310 and the base 312. A deep trench isolation structure 302 which is filled with dielectric material, such as oxide, penetrate the field oxide layer 316, the p-type bulk 306, the p-type epitaxy layer 303 and a portion of the substrate 301 to provide isolation between devices. It is noted that the deep trench isolation structure 302 is adjacent to a side of the n-type well region 304, and specifically, is adjacent to the side of the n-type well region 304 opposite the side facing the gate structure 322 in the embodiment, as shown in FIGS. 3A and 3B. Therefore, the side of the n-type well region 304 where junction breakdown path easily occurs is isolated by the deep trench isolation structure 302 to improve the weak point. Accordingly, the asymmetric LDMOS of the embodiment can reduce device pitch and further improve voltage resistance. In addition, the improvement does not increase process steps and thus cost is not increased.

Figure 4A:
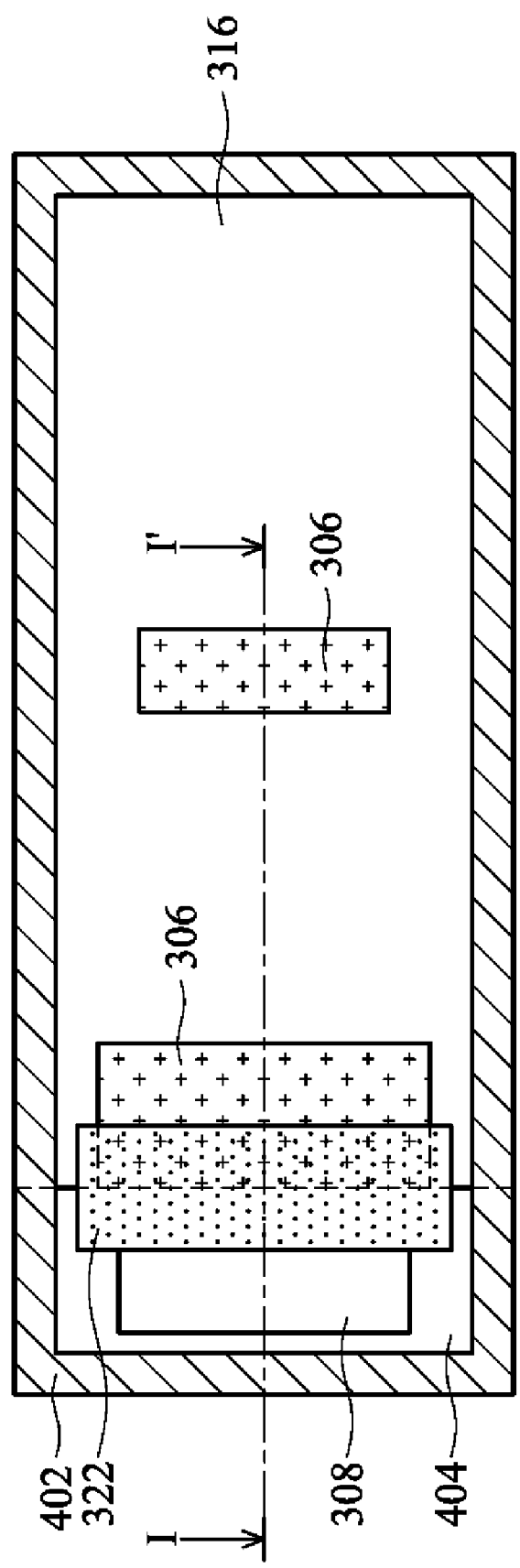
FIG. 4A shows a plane view of a lateral diffused metal oxide semiconductor transistor of another embodiment of the invention.
Figure 4B:
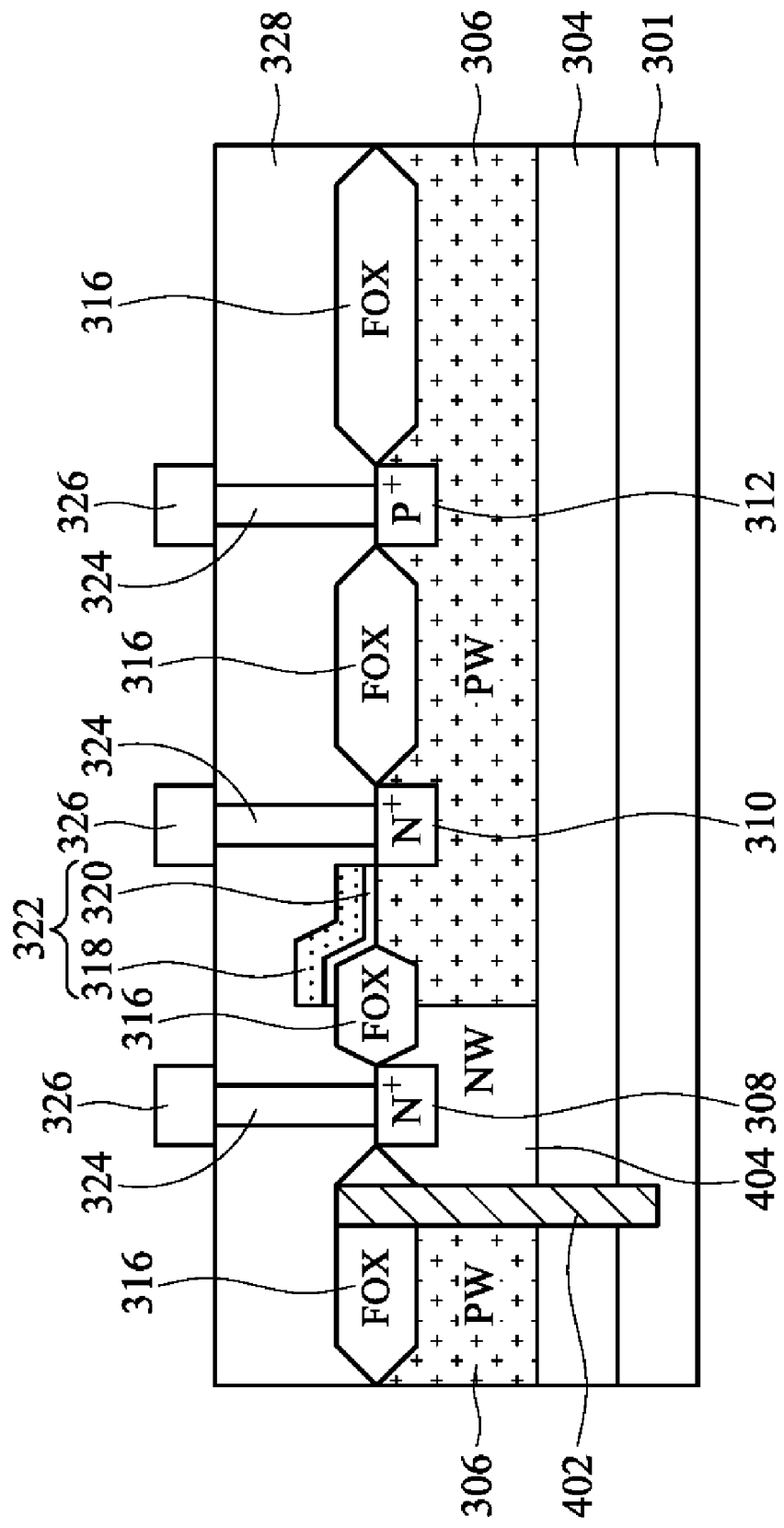
FIG. 4B shows a cross section along lines I-I' of FIG. 4A.

FIGS. 4A and 4B illustrate an asymmetric lateral diffused metal oxide semiconductor transistor (LDMOS) of another embodiment of the invention. FIG. 4A shows a plane view of a lateral diffused metal oxide semiconductor transistor of the embodiment. FIG. 4B shows a cross section along lines I-I' of FIG. 4A. The difference between the embodiment and that illustrated in FIGS. 3A and 3B is the position of the deep trench isolation structure relative to the position of the n-type well region. For simplicity, the like parts are not illustrated herein and the like elements use the same symbols.

Compared to the embodiment illustrated in FIGS. 3A and 3B, the deep isolation structure 402 of the embodiment further surrounds and contacts three sides of an n-type well region 404, as shown in FIGS. 4A and 4B. Therefore, the three sides of the n-type well region 404 where junction breakdown path easily occurs are isolated by the deep trench isolation structure 402 to improve the weak points of the three sides and increase breakdown voltage therefore. Accordingly, the asymmetric LDMOS of the embodiment can reduce device pitch and further improve voltage resistance.

Figure 5A:
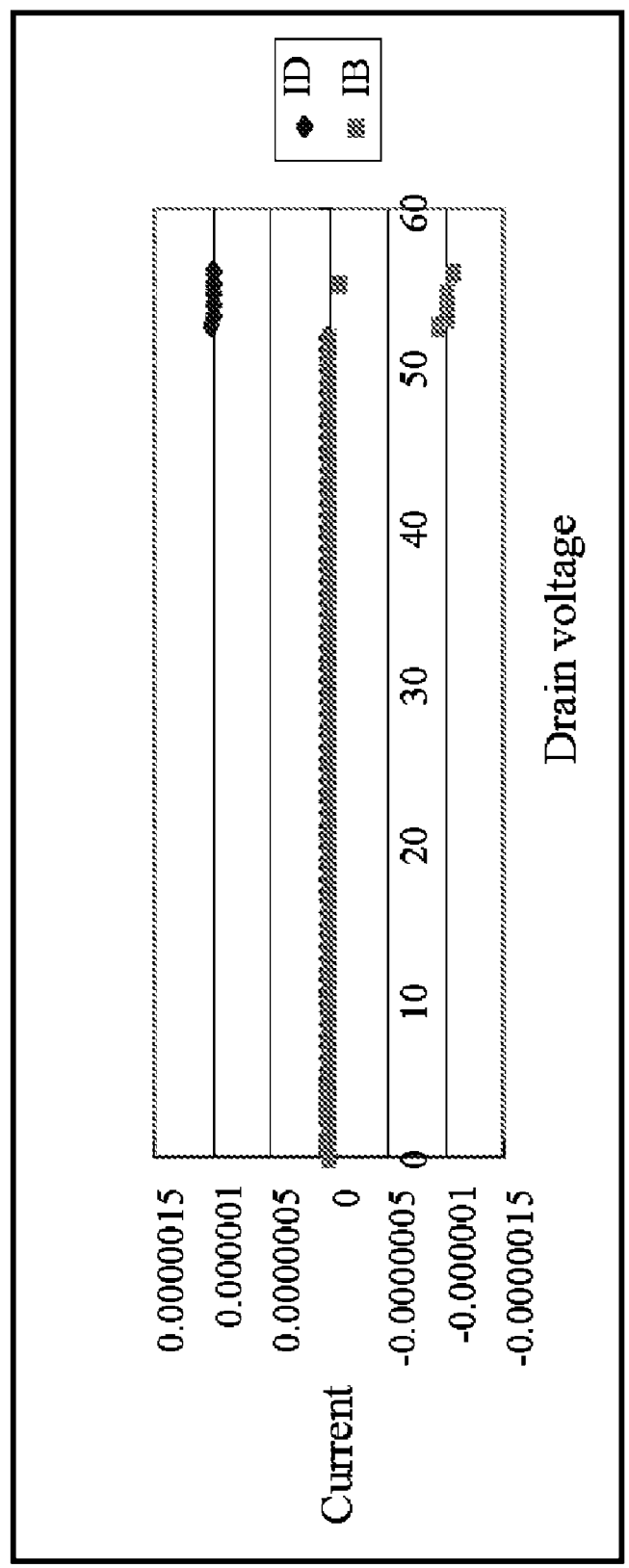
FIG. 5A shows a diagram with current as a function of drain voltage when the deep trench isolation structure of an LDMOS is separated from an n-type well region by a distance.
Figure 5B:
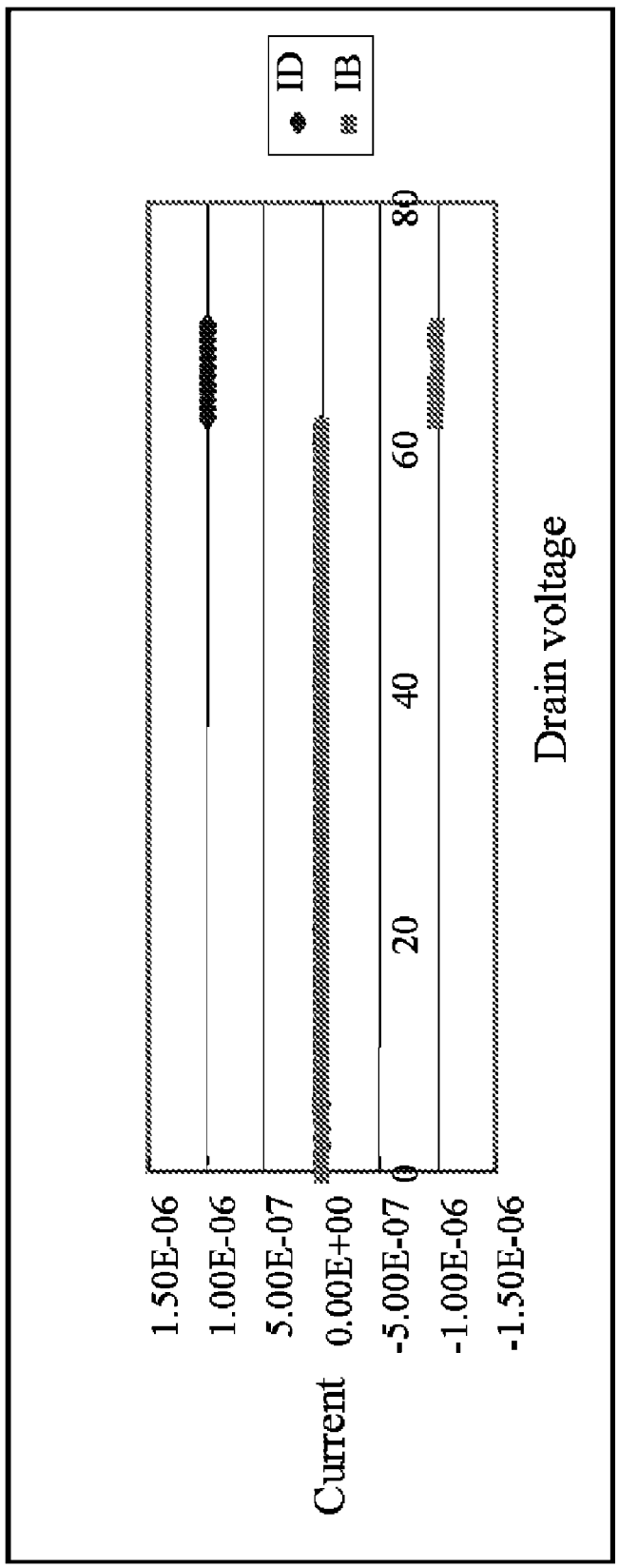
FIG. 5B shows a diagram with current as a function of drain voltage when the deep trench isolation structure of an LDMOS is adjacent to a side of the n-type well region.
Figure 5C:
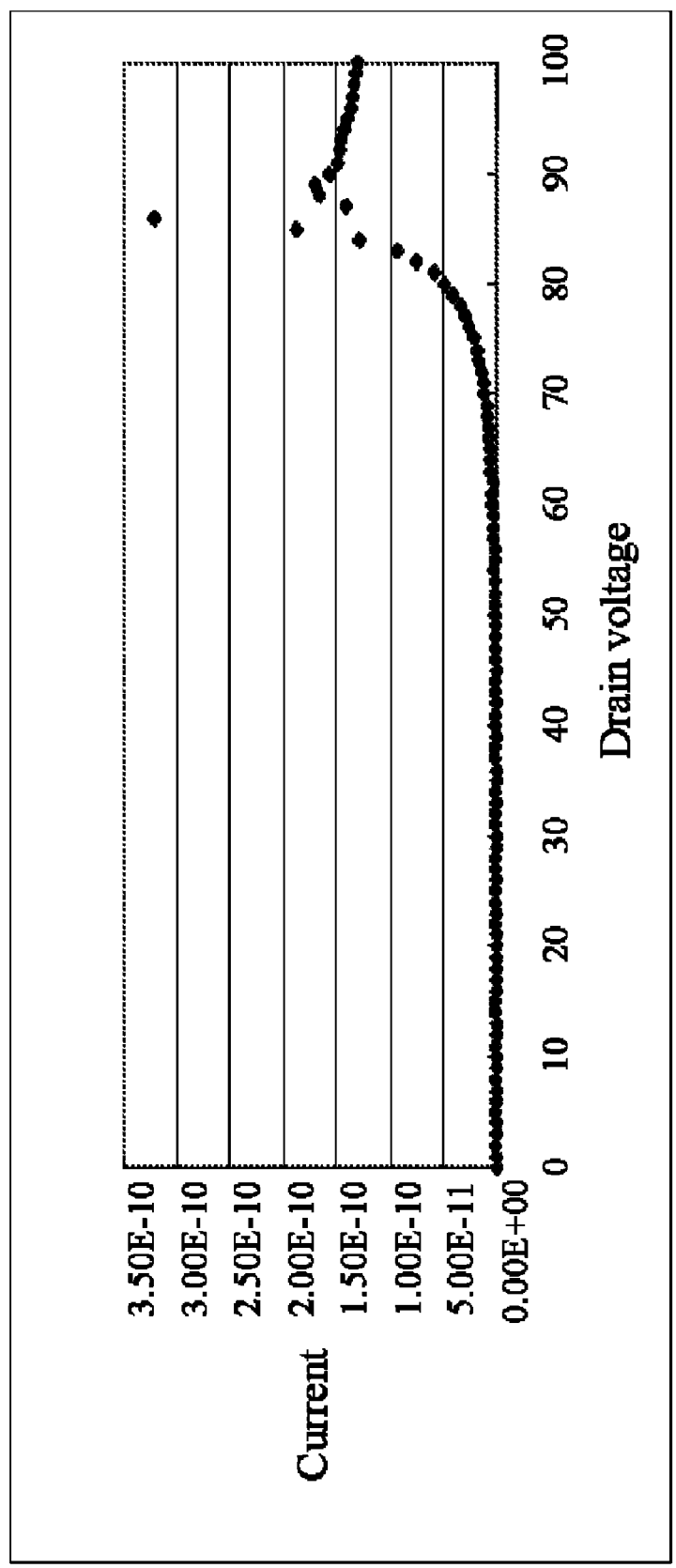
FIG. 5C shows a diagram with current as a function of drain voltage when the deep trench isolation structure of an LDMOS surrounds and contacts three sides of an n-type well region.

FIG. 5A shows a diagram with current as a function of drain voltage when the deep trench isolation structure of an LDMOS is separated from an n-type well region by a distance. FIG. 5B shows a diagram with current as a function of drain voltage when the deep trench isolation structure of an LDMOS is adjacent to a side of the n-type well region. FIG. 5C shows a diagram with current as a function of drain voltage when the deep trench isolation structure of an LDMOS surrounds and contacts three sides of an n-type well region. The breakdown voltage of the three embodiments is compared according to the diagrams of FIGS. 5A, 5B and 5C. Referring to FIG. 5A, when the deep trench isolation structure of an LDMOS is separated from an n-type well region by a distance, breakdown voltage of the device is substantially 56V. Referring to FIG. 5B, when the deep trench isolation structure of an LDMOS is adjacent to a side of the n-type well region, breakdown voltage of the device is increased to about 62V. Referring to FIG. 5C, when the deep trench isolation structure of an LDMOS surrounds and contacts three sides of an n-type well region, breakdown voltage of the device is increased to about 90~100V.

According to the aforementioned embodiments, the invention at least provides the advantages as follows. The sides of the n-type well region where junction breakdown path easily occurs are isolated by the deep trench isolation structure to improve breakdown voltage. Alternatively, device size is reduced not only by small size of the deep trench isolation structure, but by the inward setting of the deep trench isolation structure being closer to the n-type well region. Therefore, device integrity is further increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lateral diffused metal oxide semiconductor transistor, comprising:
   a substrate;
   a p-type bulk disposed on the substrate;
   an n-type well region disposed in the p-type bulk;
   a plurality of field oxide layers disposed on the p-type bulk and the n-type well region;
   a gate structure disposed on a portion of the p-type bulk and one of the plurality of field oxide layers; and
   at least one deep trench isolation structure disposed in the p-type bulk and adjacent to the n-type well region,
   wherein the deep trench isolation structure penetrates the p-type bulk, a p-type epitaxy layer above the substrate, and extends to a portion of the substrate.

2. The lateral diffused metal oxide semiconductor transistor as claimed in claim 1, wherein the deep trench isolation structure directly contacts one side of the n-type well region.

3. The lateral diffused metal oxide semiconductor transistor as claimed in claim 1, wherein the deep trench isolation structure surrounds and directly contacts three sides of the n-type well region.

4. The lateral diffused metal oxide semiconductor transistor as claimed in claim 1, further comprising an N+ drain disposed in the n-type well region.

5. The lateral diffused metal oxide semiconductor transistor as claimed in claim 4, wherein the N+ drain is adjacent to one of the field oxide layers below the gate structure.

6. The lateral diffused metal oxide semiconductor transistor as claimed in claim 1, further comprising an N+ source disposed in the p-type bulk.

7. The lateral diffused metal oxide semiconductor transistor as claimed in claim 6, wherein the N+ source is adjacent to one side of the gate structure.

8. The lateral diffused metal oxide semiconductor transistor as claimed in claim 1, further comprising a p-type epitaxy layer between the p-type bulk and the substrate.

9. The lateral diffused metal oxide semiconductor transistor as claimed in claim 8, wherein the deep trench isolation structure penetrates another field oxide layer, and the another one of the plurality of field oxide layer and the field oxide layer below the gate structure are disposed on opposite sides of the n-type well region.

10. The lateral diffused metal oxide semiconductor transistor as claimed in claim 1, wherein the lateral diffused metal oxide semiconductor transistor is an asymmetric lateral diffused metal oxide semiconductor transistor.

11. A lateral diffused metal oxide semiconductor transistor, comprising:
 a substrate;
 a p-type bulk disposed on the substrate;
 an n-type well region disposed in the p-type bulk;
 a plurality of field oxide layers disposed on the p-type bulk and the n-type well region;
 a gate structure disposed on a portion of the p-type bulk and one of the plurality of a field oxide layer of the field oxide layers; and
 a deep trench isolation structure for providing isolation between devices further insulating a breakdown path between the n-type well region and the p-type bulk,
 wherein the deep trench isolation structure surrounds and directly contacts three sides of the n-type well region.

12. The method for forming a lateral diffused metal oxide semiconductor transistor as claimed in claim 11, further comprising an N+ drain disposed in the n-type well region, and the N+ drain is adjacent to the field oxide layer below the gate structure.

13. The lateral diffused metal oxide semiconductor transistor as claimed in claim 11, further comprising a N+ source disposed in the p-type bulk and adjacent to one side of the gate structure.

14. The lateral diffused metal oxide semiconductor transistor as claimed in claim 11, wherein the deep trench isolation structure penetrate another one of the plurality of field oxide layers, and the another one of the plurality of field oxide layers and the field oxide layer below the gate structure are disposed on opposite sides of the n-type well region.

15. A method for increasing breaking down voltage of a lateral diffused metal oxide semiconductor transistor, comprising:
 providing a lateral diffused metal oxide semiconductor transistor, comprising:
 a p-type bulk disposed on the substrate;
 an n-type well region disposed in the p-type bulk;
 a plurality of field oxide layers disposed on the p-type bulk and the n-type well region;
 a gate structure disposed on a portion of the p-type bulk and one of the plurality of field oxide layers; and
 forming a deep trench isolation structure at an interface between the n-type well region and the p-type bulk for insulating a junction breakdown path between the n-type well region and the p-type bulk and thus increasing breaking down voltage of the lateral diffused metal oxide semiconductor transistor,
 wherein the deep trench isolation structure surrounds and directly contact three sides of the n-type well region.

16. The method for increasing breaking down voltage of a lateral diffused metal oxide semiconductor transistor as claimed in claim 15, wherein the deep trench isolation structure directly contacts one side of the n-type well region.

* * * * *